(12) United States Patent
Yi

(10) Patent No.: US 6,703,950 B2
(45) Date of Patent: Mar. 9, 2004

(54) GRAY CODE SEQUENCES

(75) Inventor: Cheng Yi, Burnaby (CA)

(73) Assignee: PMC Sierra, Ltd. (CA)

( * ) Notice: Subject to any disclaimer, the term of this patent is extended or adjusted under 35 U.S.C. 154(b) by 88 days.

(21) Appl. No.: 09/951,783

(22) Filed: Sep. 14, 2001

(65) Prior Publication Data

US 2003/0067401 A1 Apr. 10, 2003

(51) Int. Cl.$^7$ ............................................ H03M 7/16
(52) U.S. Cl. ......................... 341/97; 341/98; 341/159; 341/160; 377/34; 711/217; 711/218
(58) Field of Search ............................ 341/97, 98, 159, 341/160; 377/34; 711/217, 218

(56) References Cited

U.S. PATENT DOCUMENTS

| | | | | |
|---|---|---|---|---|
| 4,055,841 A | * | 10/1977 | Crawford | ..................... 341/97 |
| 4,427,972 A | * | 1/1984 | Haville et al. | .................. 341/7 |
| 4,618,849 A | | 10/1986 | Bruestle | |
| 4,780,894 A | | 10/1988 | Watkins et al. | |
| 5,001,479 A | | 3/1991 | Becker et al. | |
| 5,084,841 A | | 1/1992 | Williams et al. | |
| 5,097,491 A | | 3/1992 | Hall | |
| 5,164,968 A | | 11/1992 | Otto | |
| 5,426,756 A | | 6/1995 | Shyi et al. | |
| 5,448,606 A | * | 9/1995 | Snelgrove | ..................... 377/34 |
| 5,754,614 A | * | 5/1998 | Wingen | ..................... 377/34 |
| 6,041,370 A | | 3/2000 | Guyt | |
| 6,314,154 B1 | * | 11/2001 | Pontius | ..................... 377/16 |
| 6,337,893 B1 | * | 1/2002 | Pontius | ..................... 377/34 |

* cited by examiner

*Primary Examiner*—Michael Tokar
*Assistant Examiner*—Khai M. Nguyen
(74) *Attorney, Agent, or Firm*—Hall, Priddy, Myers & Vande Sande

(57) ABSTRACT

The present invention comprises a method of Gray encoding/decoding of binary and Gray code sequences that are less than full-length, resulting in a geometrically reduced storage requirement.

7 Claims, 7 Drawing Sheets

| Full-length Gray code ($N=4$, $L_G=16$) | Symmetric Gray code ($L_G=6$) | Non-continuous intermediate binary code | Full-length Binary Code | Binary Code ($L = 6$) | Decimal |
|---|---|---|---|---|---|
| 0 0 0 0 | 0 0 0 0 | 0 0 0 0 | 0 0 0 0 | 0 0 0 0 | 0 |
| 0 0 0 1 | 0 0 0 1 | 0 0 0 1 | 0 0 0 1 | 0 0 0 1 | 1 |
| 0 0 1 1 | 0 0 1 1 | 0 0 1 0 | 0 0 1 0 | 0 0 1 0 | 2 |
| 0 0 1 0 | 1 0 1 1 | 1 1 0 1 | 0 0 1 1 | 0 0 1 1 | 3 |
| 0 1 1 0 | 1 0 0 1 | 1 1 1 0 | 0 1 0 0 | 0 1 0 0 | 4 |
| 0 1 1 1 | 1 0 0 0 | 1 1 1 1 | 0 1 0 1 | 0 1 0 1 | 5 |
| 0 1 0 1 | | | 0 1 1 0 | | 6 |
| 0 1 0 0 | | | 0 1 1 1 | | 7 |
| 1 1 0 0 | | | 1 0 0 0 | | 8 |
| 1 1 0 1 | | | 1 0 0 1 | | 9 |
| 1 1 1 1 | | | 1 0 1 0 | | 10 |
| 1 1 1 0 | | | 1 0 1 1 | | 11 |
| 1 0 1 0 | | | 1 1 0 0 | | 12 |
| 1 0 1 1 | | | 1 1 0 1 | | 13 |
| 1 0 0 1 | | | 1 1 1 0 | | 14 |
| 1 0 0 0 | | | 1 1 1 1 | | 15 |
| (a) | (b) | (c) | (d) | (e) | |

| Full-length Gray code (N=4, $L_G$=16) | Symmetric Gray code ($L_G$=6) | Non-continuous intermediate binary code | Full-length Binary Code | Full-length Binary Code (L = 6) | Decimal |
|---|---|---|---|---|---|
| 0 0 0 0 | | | 0 0 0 0 | 0 0 0 0 | 0 |
| 0 0 0 1 | | | 0 0 0 1 | 0 0 0 1 | 1 |
| 0 0 1 1 | | | 0 0 1 0 | 0 0 1 0 | 2 |
| 0 0 1 0 | | | 0 0 1 1 | 0 0 1 1 | 3 |
| 0 1 1 0 | | | 0 1 0 0 | 0 1 0 0 | 4 |
| 0 1 1 1 | 0 1 1 1 | 0 1 0 1 | 0 1 0 1 | 0 1 0 1 | 5 |
| 0 1 0 1 | 0 1 0 1 | 0 1 1 0 | 0 1 1 0 | | 6 |
| 0 1 0 0 | 0 1 0 0 | 0 1 1 1 | 0 1 1 1 | | 7 |
| 1 1 0 0 | 1 1 0 0 | 1 0 0 0 | 1 0 0 0 | | 8 |
| 1 1 0 1 | 1 1 0 1 | 1 0 0 1 | 1 0 0 1 | | 9 |
| 1 1 1 1 | 1 1 1 1 | 1 0 1 0 | 1 0 1 0 | | 10 |
| 1 1 1 0 | | | 1 0 1 1 | | 11 |
| 1 0 1 0 | | | 1 1 0 0 | | 12 |
| 1 0 1 1 | | | 1 1 0 1 | | 13 |
| 1 0 0 1 | | | 1 1 1 0 | | 14 |
| 1 0 0 0 | | | 1 1 1 1 | | 15 |

(a) The second step maping circuit for gray code encoder with even length (b) The second step maping circuit for gray code decoder with even length

| Decimal | Binary Code ($L = 5$) | | | Repeated Binary Code | | | Rollover Binary Code ($L_{(N+1)R} = 10$) | | | Decimal |
|---|---|---|---|---|---|---|---|---|---|---|
| 0 | 0 | 0 | 0 | 0 | 0 | 0 | 0 | 0 | 0 | 0 |
| 1 | 0 | 0 | 1 | 0 | 0 | 1 | 0 | 0 | 1 | 1 |
| 2 | 0 | 1 | 0 | 0 | 1 | 0 | 0 | 1 | 0 | 2 |
| 3 | 0 | 1 | 1 | 0 | 1 | 1 | 0 | 1 | 1 | 3 |
| 4 | 1 | 0 | 0 | 1 | 0 | 0 | 1 | 0 | 0 | 4 |
| 0 | 0 | 0 | 0 | 0 | 0 | 0 | 1 | 0 | 1 | 5 |
| 1 | 0 | 0 | 1 | 0 | 0 | 1 | 1 | 1 | 0 | 6 |
| 2 | 0 | 1 | 0 | 0 | 1 | 0 | 1 | 1 | 1 | 7 |
| 3 | 0 | 1 | 1 | 0 | 1 | 1 | 1 | 0 | 0 | 8 |
| 4 | 1 | 0 | 0 | 1 | 0 | 0 | 1 | 0 | 0 | 9 |
| | (a) | | | (b) | | | (c) | | | |

Figure 6

| Full-Length Gray Code (M=4, $L_G$=16) | Symmetric Gray Code (M=4, $L_G$=10) | Non-Continuous Rollover Code | Continuous Rollover Binary Code | Rollover Binary Code (N=3, L=5) |
|---|---|---|---|---|
| 0 1 1 0 0 1 1 0 0 1 1 0 0 1 1 0 | 0 1 1 0 0 0 0 1 1 0 | 0 1 0 1 0 1 0 1 | 0 1 0 1 0 1 0 1 0 1 0 1 0 1 0 1 | 0 1 0 1 0 0 1 0 1 0 |
| 0 0 1 1 1 1 0 0 0 0 1 1 1 1 0 0 | 0 0 1 1 1 1 1 0 0 0 | 0 0 1 1 0 1 0 1 | 0 0 1 1 0 0 1 1 0 0 1 1 0 0 1 1 | 0 0 0 1 1 0 0 0 1 1 0 |
| 0 0 0 0 1 1 1 1 1 1 1 1 0 0 0 0 | 0 0 0 0 1 1 0 0 0 0 | 0 0 0 1 1 0 1 1 1 | 0 0 0 0 1 1 1 1 0 0 0 0 1 1 1 1 | 0 0 0 0 1 0 0 0 1 1 |
| 0 0 0 0 0 0 0 0 1 1 1 1 1 1 1 1 | 0 0 0 0 0 1 1 1 1 1 | 0 0 0 0 1 1 1 1 | 0 0 0 0 0 0 0 0 1 1 1 1 1 1 1 1 | 0 0 0 0 1 1 1 1 1 |
| (a) | (b) | (c) | (d) | (e) |

Figure 7

(a) The second step maping circuit for gray code encoder with any length (b) The second step maping circuit for gray code decoder with any length

GRAY CODE SEQUENCES

BACKGROUND OF THE INVENTION

1. Technical Field

The present invention relates generally to integrated circuits and logic devices. In particular, the present invention pertains to an apparatus and method for Gray encoding and decoding.

2. Description of Related Art

A Gray code sequence is characterized by the fact that there is only one bit difference between any two adjacent numbers of the sequence. In contrast, in a binary code sequence, adjacent numbers may differ by several bits. Therefore, the use of Gray code avoids the transition errors or glitches caused by simultaneous transitions of multiple bits in binary code. Table 1 shows a decimal number sequence and corresponding 4-bit binary and Gray code sequences.

TABLE 1

Decimal and 4-bit Binary and Gray Code

| Decimal Number | Gray Code | | | | Binary Code | | | |
|---|---|---|---|---|---|---|---|---|
| | G(3) | G(2) | G(1) | G(0) | B(3) | B(2) | B(1) | B(0) |
| 0 | 0 | 0 | 0 | 0 | 0 | 0 | 0 | 0 |
| 1 | 0 | 0 | 0 | 1 | 0 | 0 | 0 | 1 |
| 2 | 0 | 0 | 1 | 1 | 0 | 0 | 1 | 0 |
| 3 | 0 | 0 | 1 | 0 | 0 | 0 | 1 | 1 |
| 4 | 0 | 1 | 1 | 0 | 0 | 1 | 0 | 0 |
| 5 | 0 | 1 | 1 | 1 | 0 | 1 | 0 | 1 |
| 6 | 0 | 1 | 0 | 1 | 0 | 1 | 1 | 0 |
| 7 | 0 | 1 | 0 | 0 | 0 | 1 | 1 | 1 |
| 8 | 1 | 1 | 0 | 0 | 1 | 0 | 0 | 0 |
| 9 | 1 | 1 | 0 | 1 | 1 | 0 | 0 | 1 |
| 10 | 1 | 1 | 1 | 1 | 1 | 0 | 1 | 0 |
| 11 | 1 | 1 | 1 | 0 | 1 | 0 | 1 | 1 |
| 12 | 1 | 0 | 1 | 0 | 1 | 1 | 0 | 0 |
| 13 | 1 | 0 | 1 | 1 | 1 | 1 | 0 | 1 |
| 14 | 1 | 0 | 0 | 1 | 1 | 1 | 1 | 0 |
| 15 | 1 | 0 | 0 | 0 | 1 | 1 | 1 | 1 |

Note that in Table 1 the Gray code sequence is symmetric about the axis of reflection (between Gray codes 7 and 8) with the exception of the most-significant bit (G(3)).

There are many existing schemes for generating, encoding and decoding Gray code. See for example, U.S. Pat. No. 5,754,614 issued to Charles B. Guyt, for a Gray code counter; U.S. Pat. No. 5,448,606 issued to Andrew H. Snelgrove, for a Gray code counter; U.S. Pat. No. 4,618,849 issued to John H. Bruestle, also for a Gray code counter; U.S. Pat. No. 5,097,491 issued to Christopher M. Hall, for a modular Gray code counter; U.S. Pat. No. 5,164,968 issued to Kurt J. Otto, for a nine-bit Gray code generator; U.S. Pat. No. 5,426,756 issued to Jonathan Shyi and Kenny Shen, for a memory controller and method for determining the empty/full status of a FIFO memory using Gray code counters; and U.S. Pat. No. 5,084,841 issued to Williams et al. for a programmable Status flag generator FIFO using Gray code.

As used throughout this disclosure, L refers to the length of a binary code sequence being Gray encoded. Similarly, N is defined as the bit number of the binary code to be Gray encoded.

Gray encoders convert binary code (B) to corresponding Gray code (G). Let G(N−1) ... G(0) denote a code word for an N-bit gray code number, and let B(N−1) ... B(0) denote a code word for the corresponding binary number, where the indexes 0 and N−1 denote the least and most significant bits respectively. Then, the $i^{th}$ bit G(i) can be obtained from the corresponding binary bits as follows:

$$G(N-1)=B(N-1) \quad \text{(Eq. 1(a))}$$

$$G(i)=B(i) \text{ XOR } B(i+1) \quad 0 \leq i \leq N-2 \quad \text{(Eq. 1(b))}$$

Where the operation XOR is the Boolean operation of exclusive or for the operands between which it is positioned, defined as: 0 XOR 0=0, 1 XOR 1=0, 1 XOR 0=1, 0 XOR 1=1. FIG. 1 shows an example of the prior art logic, called a Gray encoder, to implement the above encoding procedure.

Gray decoders convert Gray code numbers to corresponding binary code numbers. Again, let G(N−1) ... G(0) denote a code word for an N-bit gray code number, and let B(N−1) ... B(0) denote the code word for the corresponding binary number, where the indices 0 and N−1 denote the least and most significant bits, respectively. The $i^{th}$ bit B(i) can be obtained as follows:

$$B(N-1)=G(N-1) \quad \text{(Eq. 2(a))}$$

$$B(i)=B(i+1) \text{ XOR } G(i) \quad 0 \leq i \leq N-2 \quad \text{(Eq. 2(b))}$$

FIG. 2 shows an example of the logic, called a gray decoder, to implement the above decoding procedure.

The disadvantage of prior art Gray encoders/decoders is that they only operate on full-length binary code sequences. A full-length binary code sequence is defined as an N-digit binary code where the length (L) is equal to two to the power N:

$$L=2^N$$

As an example of this full-length limitation, if the memory size needed for FIFO memory control logic is 18, the bit number N for the address bus has to be at least 5 ($2^4 \leq 18 \leq 2^5$). However, with N=5, the $L=2^N$ limitation for prior art Gray encoders/decoders requires that the memory size be 32, nearly twice the memory required by the memory control logic.

In view of the foregoing, it can be appreciated that a need exists for a Gray encoder/decoder that can encode/decode Gray code sequences that have lengths less than $2^N$.

SUMMARY OF THE INVENTION

The present invention includes a method of Gray encoding/decoding between Gray code sequences, that are of even length less than or equal to $2^N$ that are symmetrical about an axis of reflection with the exception of the most significant bit, and binary code sequences.

The present invention further includes a method of Gray encoding/decoding between N-bit binary code sequences, that have any length less than or equal to $2^N$, and (N+1)-bit Gray code sequences that have a length of 2*L.

Because the above methods enable the Gray encoding/decoding of binary code sequences that are less than full length, the method of the present invention results in a geometrically reduced storage requirement over the prior art.

The present invention additionally comprises a method for generating Gray Code sequences of even length less than $2^N$ where N is the bit number and which are symmetrical about an axis of reflection with the exception of the most-significant bit.

BRIEF DESCRIPTION OF THE DRAWINGS

Further features and advantages will be apparent from the following detailed description, given by way of example, of a preferred embodiment taken in conjunction with the accompanying drawings, wherein:

FIG. 3 demonstrates the mapping between Gray code with even length less than $2^N$, and binary code;

FIG. 6 demonstrates the generation of rollover binary code from binary code;

FIG. 7 demonstrates the mapping of gray code with length 2*L and rollover binary code;

DETAILED DESCRIPTION OF THE INVENTION

Symmetry of Gray Code

Figure 1:
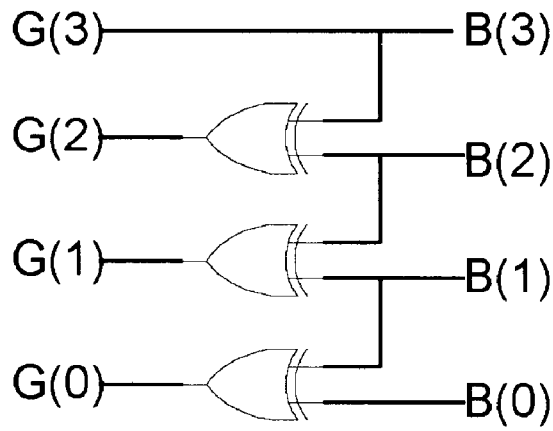
FIG. 1 shows a prior art 4-bit Gray encoder.
Figure 2:
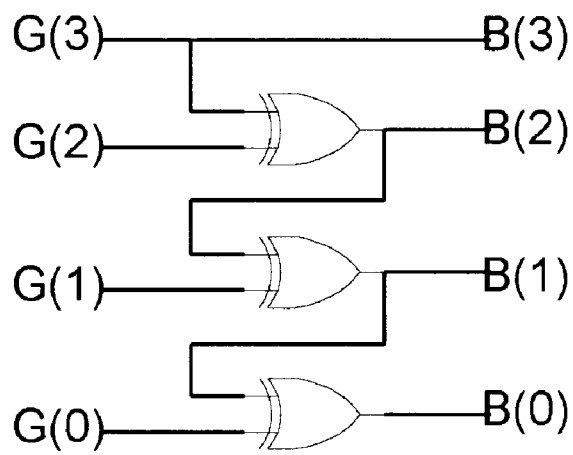
FIG. 2 shows a prior art 4-bit Gray decoder.

Referring to Table 2(a) and (b), a two-bit Gray code sequence may be generated from a one-bit Gray code sequence (note that a one-bit Gray code sequence is the same as a one-bit binary sequence) by the following iterative reflecting procedure: 1) reflect the one-bit sequence about the axis at the end of the sequence, and 2) assign a most significant bit of 0 above the axis and of 1 below the axis. Referring to Table 2(c) and (d), the three and four-bit Gray code sequences are obtained in the same manner from the two-bit and three-bit sequences respectively.

TABLE 2

Gray code with symmetric architecture

| (a) | (b) | | (c) | | (d) | |
|---|---|---|---|---|---|---|
| 0 | 0 | 0 | 0 | 00 | 0 | 000 |
| 1 | 0 | 1 | 0 | 01 | 0 | 001 |
|   | 1 | 1 | 0 | 11 | 0 | 011 |
|   | 1 | 0 | 0 | 10 | 0 | 010 |
|   |   |   | 1 | 10 | 0 | 110 |
|   |   |   | 1 | 11 | 0 | 111 |
|   |   |   | 1 | 01 | 0 | 101 |
|   |   |   | 1 | 00 | 0 | 100 |
|   |   |   |   |    | 1 | 100 |
|   |   |   |   |    | 1 | 101 |
|   |   |   |   |    | 1 | 111 |
|   |   |   |   |    | 1 | 110 |
|   |   |   |   |    | 1 | 010 |
|   |   |   |   |    | 1 | 011 |
|   |   |   |   |    | 1 | 001 |
|   |   |   |   |    | 1 | 000 |

This iterative reflecting procedure for generating Gray code is known in the prior art. However, it is reviewed here in order to highlight the symmetric architecture of Gray code that holds the key to the present invention.

Generating Gray Code Sequences with Even Length from Full-Length Gray Code Sequences Referring to Table 3(a), a full-length ($L_G=2^N$) Gray code sequence, having N=4 and $L_G$=16, is shown. The full-length Gray code sequence is divided into a first half and a second half by an axis of reflection. The first half and second half are mirror images of one another with the exception of the most significant bit. If the 10 numbers nearest the axis of reflection, 5 from the first half and 5 from the second half, are removed from the Gray code sequence, the remaining numbers still form a Gray code sequence, as is shown in Table 3(b). This demonstrates that whenever an equal number of codes are removed from immediately above and below the axis of reflection of a Gray code sequence, the resulting sequence will always be Gray code. This is because any non-most-significant bit above the axis of reflection has a mirrored image below the axis. Therefore, each of the numbers above the axis differs from its mirror image only in the most significant bit.

TABLE 3

Generation of Gray code with N = 4, $L_G$ = 6, from full-length Gray code with N = 4, $L_G$ = 16.

| (a) | | (b) |
|---|---|---|
| 0 0 0 0 | | |
| 0 0 0 1 | | |
| 0 0 1 1 | | |
| 0 0 1 0 | | |
| 0 1 1 0 | | |
| 0 1 1 1 | | 0 0 0 0 |
| 0 1 0 1 | | 0 0 0 1 |
| 0 1 0 0 | ←→ | 0 0 1 1 |
| 1 1 0 0 | | 1 0 1 1 |
| 1 1 0 1 | | 1 0 0 1 |
| 1 1 1 1 | | 1 0 0 0 |
| 1 1 1 0 | | |
| 1 0 1 0 | | |
| 1 0 1 1 | | |
| 1 0 0 1 | | |
| 1 0 0 0 | | |

Suppose that a full length ($L_G=2^N$) Gray code sequence is generated from a full length binary code ($L=2^N$) by the procedure described by Equations (1(a)) and (1(b)). One could always generate a Gray code with even length $L_G=2*K$, where $K \leq 2^{N-1}$ by removing $2^{N-1}-K$ numbers from above and below the axis of reflection as shown in Table 3 for N=4, K=3, $L_G$=6. Gray code sequences generated by this method are necessarily symmetrical about the axis of reflection, with the exception of the most significant bit, G(N−1).

Mapping Between Gray Code and Binary Code with Even Length Less than $2^N$

One aspect of the present invention comprises a method for encoding/decoding Gray code sequences that are of both even length and less than full-length ($L_G<2^N$). The method involves mapping between Gray code and an intermediate non-continuous binary code and then mapping between the intermediate non-continuous binary code and binary code.

The first algorithm of the present invention for mapping between Gray code and binary code with even length less than $2^N$:

1. Apply Equations 2(a) and 2(b) to the Gray code sequence to map to an intermediate non-continuous binary code sequence.
2. Map to binary code by subtracting $2^N-L$ from all of the codes in the intermediate non-continuous binary code sequence that are larger than $L/2-1$.

The application of this algorithm is shown in Table 4. Table 4(a), 4(b) and 4(c) show Gray code, intermediate non-continuous binary code, and binary code sequences, respectively, with N=4 and L=6. The map between the Gray code sequence in Table 4(a) and the intermediate non-continuous binary code in Table 4(b) is the same as the map between the gray code and binary code shown in Table 1. The only difference being that since the Gray code sequence is not full length, the resulting binary code sequence is non-continuous. Note that, for the sequences of Table 4, $L/2-1=6/2-1=2$ and $2^N-L=2^4-6=10$. So the binary code sequence is mapped from the intermediate non-continuous binary code by first copying all of the code numbers less than or equal to 2 and then subtracting 10 from all of the code numbers larger than 2.

TABLE 4

Mapping between Gray code and binary code through an intermediate non-continuous code.

| (a) Gray Code | (b) Intermediate | (c) Binary Code | Decimal |
|---|---|---|---|
| 0 0 0 0 | 0 0 0 0 | 0 0 0 0 | 0 |
| 0 0 0 1 | 0 0 0 1 | 0 0 0 1 | 1 |
| 0 0 1 1 | ←→ 0 0 1 0 | ←→ 0 0 1 0 | 2 |
| 1 0 1 1 | 1 1 0 1 | 0 0 1 1 | 3 |
| 1 0 0 1 | 1 1 1 0 | 0 1 0 0 | 4 |
| 1 0 0 0 | 1 1 1 1 | 0 1 0 1 | 5 |

Referring to FIG. 3(a) a full-length Gray code sequence with N=4 and L=16 is shown. A symmetric Gray code sequence with a length of 6 is generated from the full-length Gray code by the method discussed above (see FIG. 3(b)). Equations 2(a) and 2(b) are used to map from the symmetric Gray code sequence to the non-continuous intermediate binary code (see FIG. 3(c)). As is demonstrated by FIGS. 3(c) and 3(d), the non-continuous intermediate binary code corresponds to the bold-face portions of the full-length binary code. Therefore, by copying all of the full-length binary codes that are less than or equal to $L/2-1=6/2-1=2$, and by subtracting $2^N-L=2^4-6=10$ from all of the codes of the non-continuous intermediate binary code sequence that are greater than 2 (in other words, the codes of the full-length binary code greater than $L/2-1=2$ that are indicated in boldface type), one can map the non-continuous intermediate binary code sequence to binary code (FIG. 3(e)).

In order to map from a binary code sequence, with even length less than $2^N$, to Gray code, the first algorithm is applied in reverse:
1. Map between the binary code sequence and the intermediate non-continuous binary code sequence by adding $2^N-L$ to all of the numbers in the binary code sequence that are larger than $L/2-1$.
   1. Apply Equations 1(a) and 1(b) to the intermediate non-continuous binary code sequence to map to a Gray code sequence.

Note that Equations 2(a) and 2(b) are algebraically equivalent to Equations 1(a) and 1(b).

Figure 4:
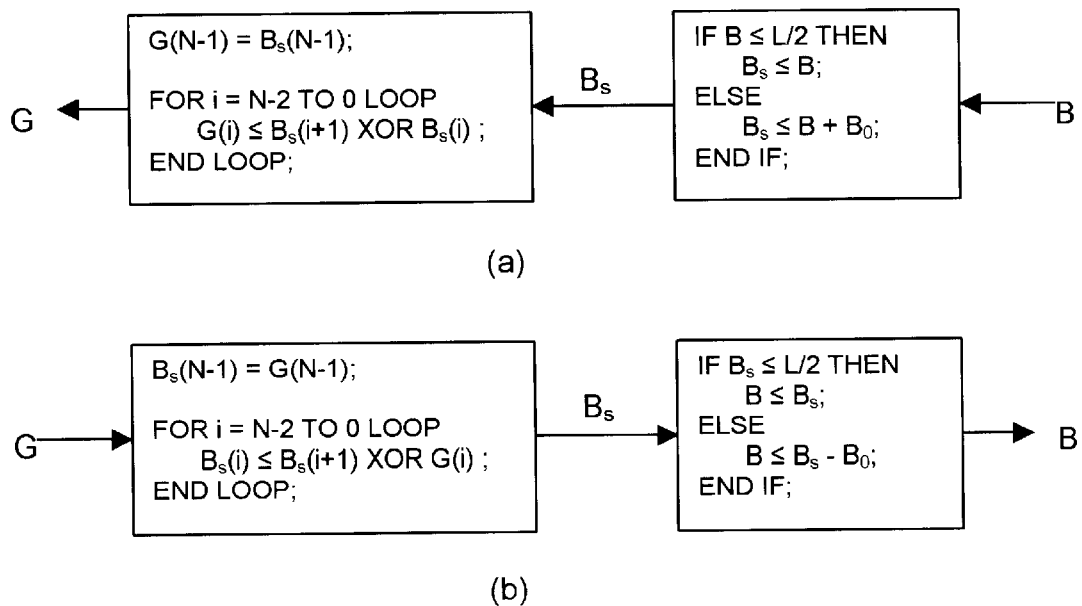
FIG. 4 shows a Gray encoder/decoder in the form of a VHDL code implementation of the first algorithm of the present invention.

Referring to FIGS. 4(a) and 4(b), a Gray encoder/decoder based on a VHDL code implementation of the first algorithm is shown. In FIGS. 4(a) and 4(b) G: Gray code; $B_o$: intermediate non-continuous binary code; B: binary code; and $B_0=2^N-L$. The Gray encoder/decoder of FIG. 4 encodes/decodes symmetric Gray code sequences with even length less than $2^N$ ($L<2^N$).

Figure 5:
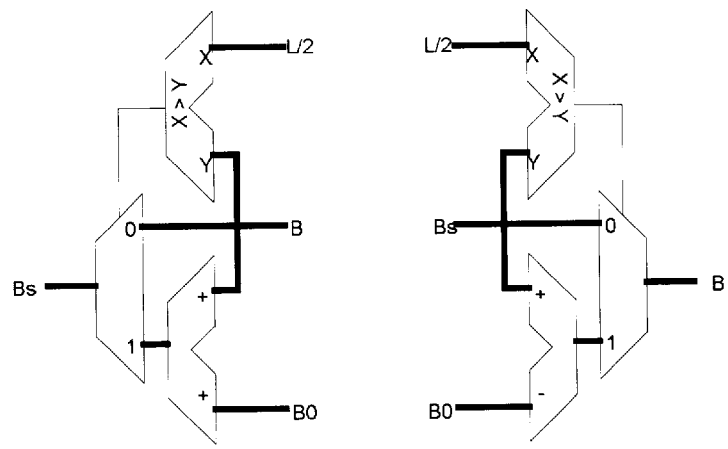
FIG. 5 shows implementation circuits for a Gray encoder and Gray decoder for the mapping step between intermediate non-continuous binary code and binary code based on the first algorithm of the present invention.

Referring to FIGS. 5(a) and 5(b), circuit embodiments of the binary code to non-continuous binary code mapping step of the first algorithm is shown. FIG. 5(a) shows a circuit implementing the binary to non-continuous binary code mapping steps and FIG. 5(b) shows the non-continuous binary code to binary code mapping steps. In each case the circuit comprises a comparator, a multiplexer and an adder.

The advantage of the first algorithm is that it permits mapping between binary and Gray code sequences of equal length that is less than full-length. However, the first algorithm is only applicable to binary and Gray code sequences of even length (i.e. L cannot be an odd number).

Mapping Between Gray Code and Binary Code with any Length Less than $2^N$

Referring to FIG. 6, given any N-bit binary code sequence with length L (as shown in FIG. 6(a)), where $L \leq 2^N$, a (N+1)-bit rollover binary code, with length 2*L (the length of a (N+1)-bit rollover binary code is denoted by $L_{(N+1)R}$, therefore $L_{(N+1)R}=2*L$ as shown in FIG. 6(c)), can be defined by repeating the N-bit binary code in series (FIG. 6(b)) and adding a rollover bit, wherein the rollover bit toggles whenever the rollover binary code changes from $(L_{(N+1)R}/2)-1$ to $L_{(N+1)R}/2$ or from $L_{(N+1)R}/2$ to $(L_{(N+1)R}/2)-1$. Note that in the example of FIG. 6, $L_{(N+1)R}=10$ and therefore the rollover bit toggles whenever the rollover binary code changes from 4 to 5 or vice versa. Table 5 shows this mapping between the (N+1)-bit rollover binary code and binary code for L=5; $L_{(N+1)R}=10$; and N=3.

TABLE 5

Map between binary code with a rollover bit and binary code for N = 3, L = 5 and $L_{(N+1)R}$ = 10.

| Decimal | Rollover | Binary Code | Binary Code | Decimal |
|---|---|---|---|---|
| 0 | 0 | 0 0 0 | 0 0 0 | 0 |
| 1 | 0 | 0 0 1 | 0 0 1 | 1 |
| 2 | 0 | 0 1 0 | 0 1 0 | 2 |
| 3 | 0 | 0 1 1 | 0 1 1 | 3 |
| 4 | 0 | 1 0 0 | ←→ 1 0 0 | 4 |
| 5 | 1 | 0 0 0 | 0 0 0 | 0 |
| 6 | 1 | 0 0 1 | 0 0 1 | 1 |
| 7 | 1 | 0 1 0 | 0 1 0 | 2 |
| 8 | 1 | 0 1 1 | 0 1 1 | 3 |
| 9 | 1 | 1 0 0 | 1 0 0 | 4 |

Referring to FIGS. 7(a) and 7(b), a symmetric (N+1)-bit Gray code sequence with less than full-length can be generated from a full-length (N+1)-bit Gray code sequence according to the methods described above under "Generating Gray Code Sequences with Even Length from Full-Length Gray Code Sequences". The symmetric (N+1)-bit Gray code of FIG. 7(b) can then be mapped to non-continuous rollover code by applying minor variations of Equations 2(a) and 2(b):

$$B(M-1)=G(M-1) \quad \text{(Eq. 3(a))}$$

$$B(i)=B(i+1) XOR\ G(i)\ 0 \leq i \leq M-2 \quad \text{(Eq. 3(b))}$$

where M is the bit number of the (N+1)-bit Gray code sequence and is equal to N+1. Equations 3(a) and 3(b) are identical to Equations 2(a) and 2(b) with the exception that the bit number N has been replaced by the bit number M. As is shown by FIGS. 7(c) and 7(d), the resulting non-continuous binary rollover code corresponds to the boldface portions of the continuous rollover binary code sequence. Therefore, the non-continuous binary rollover code can be mapped to the rollover binary code by subtracting $2^N-L=2^3-5=3$ from all the non-continuous binary rollover codes greater than L−1=5−1=4 (see FIGS. 7(c), 7(d) and 7(e)).

Accordingly, a second aspect of the present invention incorporates the above method into an algorithm to map between (N+1)-bit Gray code sequences and (N+1)-bit rollover binary code of length 2*L ($L_{(N+1)R}=L_{(N+1)G}=2*L$, where $L_{(N+1)R}$ and $L_{(N+1)G}$ denote the length of the (N+1)-bit rollover binary and Gray code sequences, respectively). The second algorithm comprises the following steps:

1. Apply Equations 3(a) and 3(b) to the (N+1)-bit Gray code sequence with length 2*L to map to an intermediate non-continuous (N+1)-bit binary code with length 2*L ($L_{(N+1)NC}=2*L$, where $L_{(N+1)NC}$ denotes the length of the intermediate non-continuous (N+1)-bit binary code).
2. Map between the intermediate non-continuous (N+1)-bit binary code and the (N+1)-bit rollover binary code by subtracting $2^N-L$ from all the intermediate non-continuous (N+1)-bit code which is greater than L−1.

Table 6(a), (b) and (c) shows an (N+1)-bit Gray code sequence, (N+1)-bit intermediate non-continuous binary code and the (N+1)-bit rollover binary code respectively for N=3 and L=$L_{(N+1)G}/2$=($L_{(N+1)R}$)/2=($L_{(N+1)NC}$)/2=5. The map between the (N+1)-bit Gray code in Table 6(a) and the intermediate non-continuous (N+1)-bit binary code in Table 6(b) is similar to the mapping discussed above with respect to the prior art. Note that L=5 and $2^N-L=2^3-5=3$. Therefore, according to the second step of the algorithm, the (N+1)-bit rollover binary code can be mapped from the intermediate non-continuous binary code by copying all the intermediate non-continuous binary code less than or equal to 2 and subtracting 3 from all the intermediate non-continuous binary code larger than 4.

TABLE 6

Map between Gray code and rollover binary code for N = 3 and L = 5.

| (a) Gray Code | | (b) Non-continuous Binary Code | | (c) Rollover Binary Code |
|---|---|---|---|---|
| 0 0 0 0 | } | 0 0 0 0 | } | 0 0 0 0 |
| 0 0 0 1 |  | 0 0 0 1 |  | 0 0 0 1 |
| 0 0 1 1 |  | 0 0 1 0 |  | 0 0 1 0 |
| 0 0 1 0 |  | 0 0 1 1 |  | 0 0 1 1 |
| 0 1 1 0 | ←→ | 0 1 0 0 | ←→ | 0 1 0 0 |
| 1 1 1 0 |  | 1 0 1 1 |  | 1 0 0 0 |
| 1 0 1 0 |  | 1 1 0 0 |  | 1 0 0 1 |
| 1 0 1 1 |  | 1 1 1 0 |  | 1 0 1 1 |
| 1 0 0 0 |  | 1 1 1 1 |  | 1 1 0 0 |

Once an (N+1)-bit Gray code sequence has been decoded to a (N+1)-bit rollover binary code by application of the second algorithm, the (N+1)-bit rollover binary code may be mapped to binary code by means familiar to a person skilled in the art.

In order to Gray encode a (N+1)-bit rollover binary code sequence with length 2*L, variations of Equations 1(a) and 1(b) are applied:

$$G(M-1)=B(M-1) \quad \text{(Eq. 4(a))}$$

$$G(i)=B(i) XOR\ B(i+1)\ 0 \leq i \leq M-2 \quad \text{(Eq. 4(b))}$$

where M is the bit number of the (N+1)-bit Gray code sequence and is equal to N+1. Equations 4(a) and 4(b) are identical to Equations 1(a) and 1(b) with the exception that the bit number N has been replaced by the bit number M. In order to map between (N+1)-bit rollover binary code and (N+1)-bit Gray code sequences, the second algorithm is applied in reverse:

1. Map between the (N+1)-bit rollover binary code and the intermediate non-continuous (N+1)-bit binary code by adding $2^N-L$ to all the (N+1)-bit rollover binary code which is greater than L−1.
2. Apply Equations 1(a) and 1(b) to the (N+1)-bit intermediate non-continuous binary code to map to a (N+1)-bit Gray code sequence with length 2*L.

The advantage of the second algorithm with respect to the first algorithm is that the second algorithm Gray encodes/decodes binary code sequences with any length, odd or even, less than $2^N$. However, the length of the subject Gray code sequence, rollover binary code sequence and non-continuous binary code sequence are doubled with respect to the corresponding binary code sequence and, as a result, they are one bit wider (N+1) than the corresponding binary code sequence (N).

Figure 8:
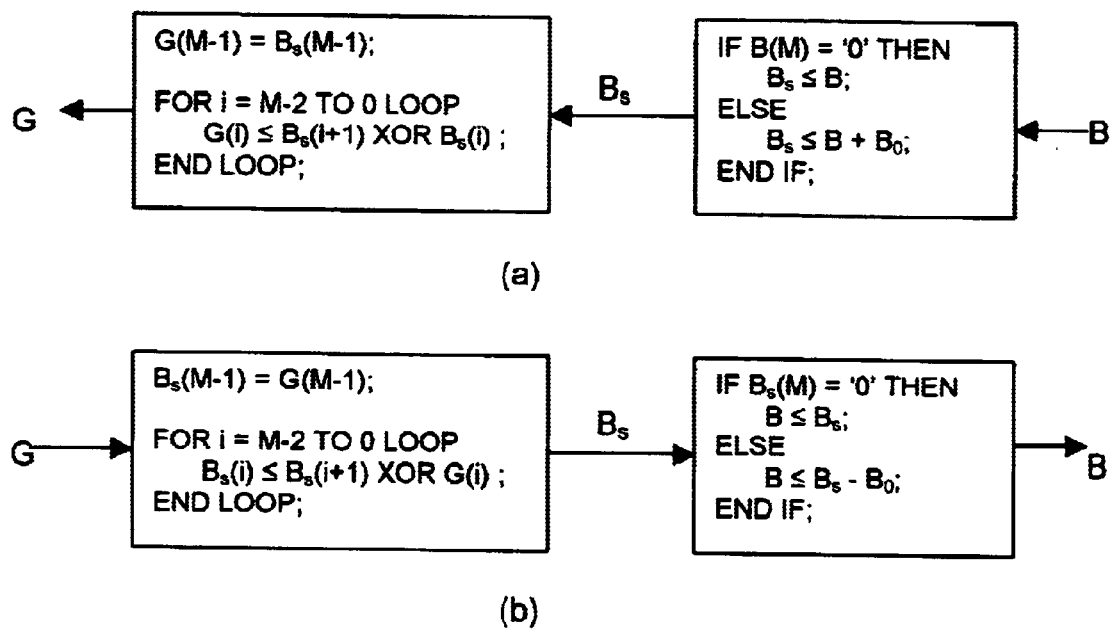
FIG. 8 shows a Gray encoder/decoder in the form of a VHDL code implementation of the second algorithm of the present invention.

Referring to FIGS. 8(a) and 8(b), a Gray encoder/decoder is shown based on a VHDL code implementation of the above algorithms. In FIGS. 8(a) and 8(b) G: Gray code; $B_0$: intermediate non-continuous binary code; B: rollover binary code; and $B_0=2^N-L$.

Figure 9:
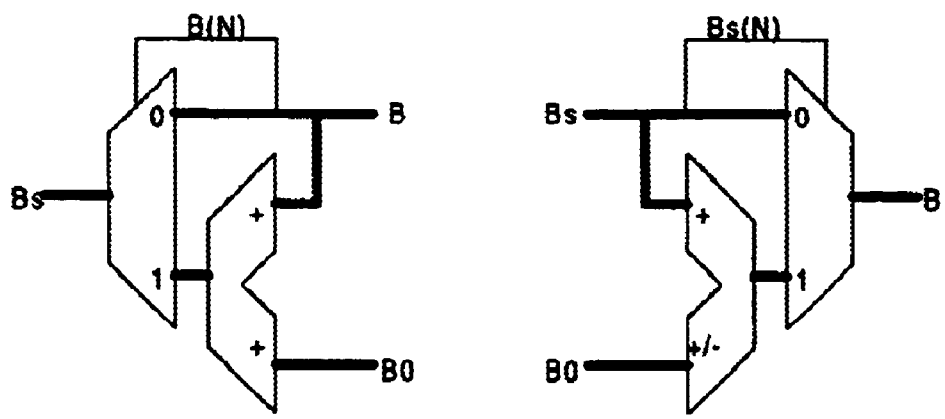
FIG. 9 shows implementation circuits for a Gray encoder and Gray decoder for the mapping step between intermediate non-continuous (N+1)-bit binary code and (N+1)-bit binary code based on the second algorithm of the present invention.

A VHDL implementation of the mapping between binary code and rollover binary code is shown in FIG. 9.

Referring to FIGS. 9(a) and 9(b), a circuit embodiment of the rollover binary code to intermediate non-continuous rollover binary code mapping step of the above algorithm is shown. In each case the circuit comprises a comparator, a multiplexer and an adder. The mapping step between the rollover binary code and the binary code can be achieved with an additional register and comparator.

While this invention has been described with reference to illustrative embodiments, this description is not intended to be construed in a limiting sense various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method of mapping between a binary code sequence and a Gray code sequence, said method comprising one of the following two sets of steps:
   (a) mapping between said Gray code sequence and a non-continuous intermediate binary code sequence by applying the following equations to codes of said Gray code sequence:

$$B(N-1)=G(N-1)$$

$$B(i)=B(i+1) XOR\ G(i) \text{ for } 0 \leq i \leq N-2;$$

and
   (b) mapping between said non-continuous intermediate binary code sequence and said binary code sequence by subtracting $2^N-L$ from all codes in said non-continuous intermediate binary code sequence that are larger than (L/2)−1;

and (a) mapping between said binary code sequence and said non-continuous intermediate binary code sequence by adding $2^N-L$ to all codes in said binary code sequence that are larger than $(L/2)-1$; and (b) mapping between said non-continuous intermediate binary code sequence and said Gray code sequence by applying the following equations to codes of said non-continuous intermediate binary code sequence:

$$G(N-1)=B(N-1)$$

$$G(i)=B(i) XOR\ B(i+1) \text{ for } 0 \leq i \leq N-2$$

wherein in both of said sets of steps B designates said non-continuous binary code, G designates said Gray code sequence, and i is a number of a bit being calculated, wherein said binary code sequence has a length L where L is an even number less than or equal to $2^N$, where N is a bit number for both said binary code sequence and said Gray code sequence, where B(N-1) and G(N-1) denote most significant bits of said non-continuous intermediate binary code sequence and said Gray code sequence, respectively, and further wherein said Gray code sequence is symmetrical about an axis of reflection with the exception of said most-significant bit.

2. The method of claim 1, wherein said Gray code sequence with a length that is less than $2^N$, is generated by the following method:

(a) providing a full-length Gray code sequence with bit number N and an axis of reflection; and (b) removing from said full-length Gray code sequence $2^{N-1}$—K codes from above said axis of reflection and $2^{N-1}$—K codes from below said axis of reflection, where K is less than or equal to $2^{N-1}$.

3. The method of claim 1, wherein said method is carried out as steps of a computer program.

4. The method of claim 3, wherein said computer program is written in VHDL code.

5. A method of mapping between a binary code sequence and a Gray code sequence, said method comprising one of the following two sets of steps:

(a) mapping from said Gray code sequence to an intermediate non-continuous binary code sequence according to the formulae:

$$B(M-1)=G(M-1)$$

$$B(i)=B(i+1) XOR\ G(i) \text{ for } 0 \leq i \leq M-2;$$

and (b) mapping between the intermediate non-continuous binary code sequence and a rollover binary code sequence by subtracting $2^N-L$ from all intermediate non-continuous binary codes which are greater than $L-1$;

and (a) mapping between the rollover binary code sequence and the intermediate non-continuous binary code sequence by adding $2^N-L$ to all rollover binary codes which are greater than $L-1$; and (b) mapping the intermediate non-continuous binary code sequence to the Gray code sequence according to the following formulae:

$$G(M-1)=B(M-1)$$

$$G(i)=B(i) XOR\ B(i+1) \text{ for } 0 \leq i \leq M-2$$

wherein in both of said sets of steps said binary code sequence has a length L, where L is a number less than or equal to $2^N$, where N is a bit number of said binary code sequence, and where M is a bit number of said Gray code sequence, said intermediate non-continuous binary code sequence, and said rollover binary code sequence equal to N+1, and where lengths of said Gray code sequence, said intermediate non-continuous binary code sequence, and said rollover binary code sequence are equal to 2*L, wherein G(M-1) and B(M-1) denote most significant bits of said Gray code sequence and said intermediate non-continuous binary code sequence, and wherein said Gray code sequence is symmetrical about an axis of reflection with the exception of a most-significant bit.

6. The method of claim 5, wherein said method is carried out as steps of a computer program.

7. The method of claim 6, wherein said computer program is written in VHDL code.

* * * * *

UNITED STATES PATENT AND TRADEMARK OFFICE
CERTIFICATE OF CORRECTION

PATENT NO. : 6,703,950 B2
DATED : March 9, 2004
INVENTOR(S) : Cheng Yi

It is certified that error appears in the above-identified patent and that said Letters Patent is hereby corrected as shown below:

Column 1,
Line 59, change "Status" to -- status --

Column 2,
Lines 7, 21 and 36, change "$\leqq$" to -- $\leq$ --

Column 4,
Line 50, change "$\leqq$" to -- $\leq$ --

Column 6,
Line 1, change "$B_o$" to -- $B_s$ --
Line 22, change "$\leqq$" to -- $\leq$ --

Column 7,
Table 6, delete lines 55-59
Table 6, insert in lines 55-59 the following:
-- 1110  1011    1000
   1010  1100    1001
   1011  1101    1010
   1001  1110    1011
   1000  1111    1100 --

Column 8,
Lines 3 and 60, change "$\leqq$" to -- $\leq$ --
Line 29, change "$B_o$" to -- $B_s$ --
Line 32, delete "A VHDL implementation of the mapping between binary code and rollover binary code is shown in Figure 9".
Line 43, insert -- . -- after "sense" and capitalize the "v" in "various".

Column 9,
Line 13, change "$\leqq$" to -- $\leq$ --

UNITED STATES PATENT AND TRADEMARK OFFICE
CERTIFICATE OF CORRECTION

PATENT NO. : 6,703,950 B2
DATED : March 9, 2004
INVENTOR(S) : Cheng Yi

It is certified that error appears in the above-identified patent and that said Letters Patent is hereby corrected as shown below:

Column 10,
Lines 3 and 23, change "$\leqq$" to -- $\leq$ --

Signed and Sealed this

Eighth Day of March, 2005

JON W. DUDAS
*Director of the United States Patent and Trademark Office*